United States Patent
Satonaka

(10) Patent No.: US 6,909,053 B2
(45) Date of Patent: Jun. 21, 2005

(54) CIRCUIT SUBSTRATE CONNECTING STRUCTURE, LIQUID CRYSTAL DISPLAY DEVICE HAVING THE CONNECTING STRUCTURE AND MOUNTING METHOD OF LIQUID CRYSTAL DISPLAY DEVICE

(75) Inventor: Masaharu Satonaka, Kagoshima (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 198 days.

(21) Appl. No.: 10/259,543

(22) Filed: Sep. 27, 2002

(65) Prior Publication Data

US 2003/0063452 A1 Apr. 3, 2003

(30) Foreign Application Priority Data

Oct. 2, 2001 (JP) ......................................... 2001-306404

(51) Int. Cl.[7] ................................................. H05K 1/02
(52) U.S. Cl. ........................ 174/259; 174/260; 174/261; 361/803
(58) Field of Search ................................. 361/792–795, 361/803; 174/259, 260, 261; 29/830

(56) References Cited

U.S. PATENT DOCUMENTS 5,729,315 A * 3/1998 Takahashi et al. .......... 349/149
5,804,882 A * 9/1998 Tsukagoshi et al. ........ 257/783
6,528,889 B1 * 3/2003 Matsuhira et al. .......... 257/778

FOREIGN PATENT DOCUMENTS

EP 0814510 A2 * 12/1997 ......... H01L/23/798
JP 3-120790 5/1991

* cited by examiner

Primary Examiner—Phuong T. Vu
Assistant Examiner—Jeremy Norris
(74) Attorney, Agent, or Firm—Choate, Hall & Stewart LLP

(57) ABSTRACT

In connecting a connecting substrate 4 to a flexible substrate 5 connected to a terminal portion of one of substrates constituting a liquid crystal display panel through an anisotropic conductive film (ACF) 20, a bonding assist member 17 formed of the same material as that of an internal wiring or a connecting terminal of the connecting substrate and having substantially the same height as that of the connecting terminal is provided between adjacent terminal groups each including a plurality of connecting terminals 4b in a terminal forming region of a non-coating portion 14 in the vicinity of the connecting substrate 4, to absorb a difference in height between the terminal groups and the non-coating portion by the bonding assist member 17 to thereby make the ACF in an intimate contact with the terminal groups as well as the exposed regions uniformly throughout thereof during a temporary press-bonding step of the ACF and prevent a peeling-off and/or breakage of the ACF between the terminal groups and improve the reliability of electrical connection.

10 Claims, 9 Drawing Sheets

CIRCUIT SUBSTRATE CONNECTING STRUCTURE, LIQUID CRYSTAL DISPLAY DEVICE HAVING THE CONNECTING STRUCTURE AND MOUNTING METHOD OF LIQUID CRYSTAL DISPLAY DEVICE

BACKGROUND OF THE INVENTION

1. Field of the Invention

The present invention relates to a connecting structure of a circuit substrate and, in particular, the present invention relates to a connecting structure for connecting flexible substrates and a circuit board of a liquid crystal display device and to a liquid crystal display having the same connecting structure. The present invention further relates to a mounting method of the liquid crystal display device.

2. Description of the Prior Art

A liquid crystal display has been widely used in a field of OA (Office Automation) devices, AV (Audio-video) devices and portable terminals, etc., due to its thin and lightweight structure and low power consumption characteristics thereof. The liquid crystal display device is generally constructed with a liquid crystal panel composed of a TFT substrate on which thin film transistors are provided as switching elements, an opposing substrate and liquid crystal sealed in a gap between the TFT substrate and the opposing substrate and an external substrate having external circuits such as drive circuit, etc., and connected to the liquid crystal panel, for controlling display thereon.

In order to connect the liquid crystal panel to the external substrate, it is usual to connect terminals on one side of at least one flexible substrate to a terminal portion provided on at least one peripheral edge portion of the liquid crystal panel and to connect terminals on the other side of the flexible substrate to terminals of the external substrate and, in order to realize the miniaturization and low cost of the liquid crystal display, an anisotropic conductive film (ACF) is usually used for connection between the flexible substrate and the external substrate.

The ACF is formed by dispersing electrically conductive particles in a thermosetting adhesive and, after the ACF is formed on one of the substrates of the liquid crystal panel by painting or the ACF in the form of a tape is adhered thereto and the other substrate is arranged in an opposing relation to the one substrate, the thermosetting adhesive of the ACF is solidified by heating it while the ACF is pressed to the connecting terminals with the conductive particles being in a gap between the connecting terminals of the respective substrates, so that it is possible to obtain high electric conductivity of the ACF while maintaining its mechanical strength, even in a case where the gap between the terminals is narrow and there is no margin in a mounting space.

The connecting method of the external substrate in the liquid crystal display device using the ACF will be described with reference to FIG. 1 and FIG. 7A to FIG. 11B. FIG. 1 is a perspective view showing a whole construction of the liquid crystal display device, FIG. 7A and FIG. 7B are plan views showing a structure of a conventional external substrate and FIG. 8 is a cross section taken along a line B–B' in FIG. 7A. FIG. 9A to FIG. 9C are cross sections showing the steps of the conventional connecting method using the ACF, FIG. 10A and FIG. 10B and FIG. 11A and FIG. 11B illustrate problems of the conventional connecting method.

As shown in FIG. 1, a liquid crystal display device 1 comprises a liquid crystal panel 2 constructed with a TFT substrate having thin film transistors formed thereon as switching elements, an opposing substrate opposing to the TFT substrate and liquid crystal sealed in a gap between the substrates, a backlight 7 composed of a fluorescent lamp 10, a reflector 11 and a light guiding plate 9, etc., and casings 13a and 13b supporting these components. An external substrate having external circuits such as drive circuits formed thereon (referred to as a connecting substrate 4, hereinafter) is connected to a terminal portion 3 provided in at least one peripheral portion of one of the substrates of the liquid crystal panel 2. FIG. 7A shows the connecting substrate 4 in an enlarged scale and FIG. 7B shows a plurality of flexible substrates 5 connected to the connecting substrate 4.

A wiring pattern is formed on the connecting substrate 4 by using a copper thin film. The connecting substrate 4 is usually in the form of a lamination of a glass fiber cloth base, an epoxy resin layer and a copper film in the order and will be referred to as a glass-epoxy substrate material 4a, hereinafter. The connecting substrate 4 is electrically insulated and protected by a coating resin such as resist resin. In each connecting portion thereof to be connected to the flexible substrates 5, a non-coating portion 14 is provided by removing the coating resin provided thereon. In the non-coating portion 14, terminal group forming regions 15 are formed at a predetermined interval and a plurality of connecting terminals 4b are formed in each terminal group forming region 15 of the non-coating portion 14 by plating the patterned copper film with gold or nickel to form a terminal group. The terminal groups are connected to the flexible substrates 5, respectively.

FIG. 8 is a cross section taken along a line B–B' of the connecting substrate 4 shown in FIG. 7A. As shown in FIG. 8, the terminal groups each having a plurality of the connecting terminals 4b arranged at a predetermined interval are formed on the glass epoxy base material 4a of the connecting substrate 4 as the copper thin film pattern. There is an exposed region 16a, in which the glass epoxy base material 4a is exposed, is provided between adjacent terminal group forming regions 15. Although it is generally practical that each connecting terminal 4b is several tens microns high and a pitch of the connecting terminals 4b is several hundreds microns, height of the connecting terminals 4b is shown exaggeratedly in FIG. 8.

The connecting method for connecting the connecting substrate 4 and the flexible substrates 5, which have the above mentioned structures, will be described with reference to FIG. 9A to FIG. 9C. It should be noted that, in the following description, the connection is performed by using an isotropic electrically conductive film (ACF). In general, the connection is performed by using the ACF 20 in two steps, that is, the first step of temporary press-bonding of the ACF 20 to one of the substrates of the liquid crystal panel at low temperature and the second step of final press-bonding of the ACF thereto at high temperature after the other substrate is arranged in an opposing relation to the one substrate to which the ACF is temporarily bonded.

In concrete, as shown in FIG. 9A, the ACF 20 is formed by uniformly dispersing electrically conductive particles in a highly insulating resin such as epoxy resin or acrylic resin and a separator film 19 is stuck on one of surfaces of the ACF 20. The ACF 20 with the separator 19 is cut such that it substantially coincides in size and shape with the non-coating portion 14 of the connecting substrate 4. The ACF 20 with the separator 19 is put on a surface of the non-coating portion 14 with the ACF 20 being in direct contact with the terminal forming regions 15 and the exposed regions 16a and the ACF 20 is temporarily bonded to the connecting substrate 4 by pressing the film down by a press-bonding head 18 while heating the lamination to a predetermined low temperature. This temporary press-bonding step is to temporarily bond the ACF 20 to the connecting substrate 4 with bonding strength enough to prevent the ACF 20 from being peeled off from the connecting terminals 4b thereof. In this state, the bonding resin of the ACF 20 is not completely solidified.

Thereafter, as shown in FIG. 9B, the separator 19 is peeled off from the surface of the ACF 20 to expose a bonding surface of the ACF 20. Thereafter, as shown in FIG. 9C, the flexible substrates 5 are arranged on the ACF 20 such that the flexible substrates are opposed to the respective terminal groups in the terminal forming regions and then the pressure is exerted on the flexible substrates 5 while heating them again to a predetermined high temperature. Therefore, the connecting terminals 4b of the connecting substrate 4 are electrically connected to the terminals of the flexible substrates 5 through the electrically conductive particles contained in the ACF 20 and the electrical connection is maintained fixedly by hardening the resin.

However, there are problems in the conventional connecting method for connecting the connecting substrate 4 and the flexible substrates 5 by means of the ACF.

That is, in the conventional method, the glass-epoxy base material 4a of the connecting substrate 4 is exposed in areas each between adjacent terminal forming regions and, therefore, there is a difference in height between the terminal forming regions and the exposed regions. The difference corresponds to the height of the connecting terminals 4b. Consequently, although temperature and pressure applied from the press-bonding head 18 are transmitted to the ACF 20 on the connecting terminals 4b substantially during the temporary press-bonding of the ACF 20 to the connecting substrate 4, the temperature and pressure are not transmitted enough from the press-bonding head 18 to the ACF 20 on the exposed regions 16a in which the glass-epoxy base material 4a is exposed. Therefore, bonding strength of the ACF 20 in the exposed region 16a is substantially low compared with that is the terminal forming regions 15 and the ACF 20 in the exposed regions 16a may be peeled off from the glass-epoxy base material 4a when the separator 19 is peeled off from the ACF 20, resulting in that the ACF 20 floats up in the exposed regions 16a as shown in FIG. 9B.

If the final press-bonding of the flexible substrates 5 is performed in such state, pressing force is transmitted from the floating portion 21 of the ACF 20 to the terminal forming regions 15 even if the connection is maintained in the temporary press-bonding, as shown in FIG. 9C, so that the reliability of connection is gradually degraded.

Further, depending upon the distance between adjacent terminal forming regions 15 and the surface condition of the exposed regions 16a, there may be a case where the ACF 20 in the exposed region 16a is attracted by the separator 19 and broken when the separator 19 is peeled off, as shown in FIG. 10A. If the flexible substrates 5 are mounted and the final press-bonding operation is performed in a state where the ACF 20 is broken and a broken portion of the ACF 20 is bent back as shown by reference numeral 22 in FIG. 10A, thickness of the ACF 20 is increased at location in which it is folded, so-that there may be a variation of the thickness of the ACF 20 on the connecting terminals 4b of the connecting substrate 4, as shown in FIG. 10B. Therefore, temperature thereof and pressure applied thereto are not uniform during the final press-bonding operation and so the bonding strength may be partially lowered and there may be portions 23, which lose an intimate electric contact. Further, in such case, since the ACF 20 is a resin film containing electrically conductive particles dispersed therein, the distribution of the electrically conductive particles on the respective connecting terminals 4b may become non-uniform, resulting in non-uniform electrical connection.

Further, there may be a case where the ACF 20 on not only the exposed regions 16a but also the connecting terminals 4b is turned up when the separator 19 is peeled off after the temporary press-bonding, as shown in FIG. 11A. In such case, there may be no ACF on a portion of the connecting terminals 4b. Therefore, it may be impossible to maintain normal electrical connection between the terminals of the flexible substrates 5 and the connecting terminals 4b as shown by a reference numeral 23 in FIG. 11B, resulting in that a resultant liquid crystal display device does not function normally.

It is clear that these problems result from the fact that it is impossible to absorb the step between the terminal forming regions 15 and the exposed regions 16a of the connecting substrate 4 caused by the lowness of temperature of the ACF 20 and pressure applied to the ACF 20 during the temporary press-boding step and degraded adhesion between them due to flatness of surface of the exposed regions 16a. As a method for relaxing the influence of such step between the terminal forming region and the exposed region, an insertion of a shock-absorbing member into between a press-bonding head and an ACF is proposed in, for example, JP H03-120790A.

In JP H03-120790A, during a temporary press-bonding step at low temperature or a final press-bonding step at high temperature, the shock-absorbing member is disposed between the press-bonding head and the ACF to absorb a difference in height between connecting terminal forming regions and exposed regions. The effect of the shock-absorbing member may be obtained if this technique is applied in the final press-bonding step in which temperature and pressure are high. However, when this technique is applied to the temporary press-bonding at low temperature, the effect of absorbing the step on a surface to which the ACF is bonded and uniformly transmitting temperature and pressure to the ACF can not be obtained enough due to lowness of temperature and pressure. Even if such effect is obtained, it may be varied depending upon the size of the exposed regions 16a.

It may be possible to apply some pressure to the exposed region 16a between the terminal forming regions by providing the shock-absorbing member. However, since the glass-epoxy base material 4a is exposed in the exposed region 16a and the adhesive is not solidified enough in the temporary press-bonding, the adhesion between the ACF 20 and the glass-epoxy base material 4a becomes not enough, so that the problem of the peeling-off of the ACF 20 when the separator 19 is peeled off can not be solved.

Further, the shock-absorbing member disclosed in JP H03-120790A is gradually degraded and deformed by repetitive use thereof in the press-bonding step. Therefore, in order to reliably connect the flexible substrates 5 to the connecting substrate 4, the shock-absorbing members must be replaced frequently. Therefore, extra materials and additional fabrication steps are required, causing the cost of resultant liquid crystal display device to be increased.

SUMMARY OF THE INVENTION

An object of the present invention is to provide a connection structure of a circuit substrate of a liquid crystal display device, with which a peeling-off of an anisotropic conductive film (ACF) during a temporary press-bonding step can be prevented without using any shock-absorbing member.

Another object of the present invention is to provide a liquid crystal display device having the connection structure.

A further object of the present invention is to provide a mounting method of the liquid crystal display device.

According to the present invention, in order to achieve the above objects, a connection structure of a circuit board connected to an opposing substrate through an anisotropic conductive film, in which a plurality of terminal groups each including a plurality of terminals connected to internal wiring lines and exposed in a connecting region formed by removing a surface protective member in a vicinity of side portions of the circuit board are arranged at a predetermined interval, resides in that bonding assist members are arranged on regions of the circuit board each between adjacent terminal forming regions in the connecting region of the connecting substrate.

The bonding assist member is formed of the same material as that of the internal wiring line or the connecting terminal and has substantially the same height as that of the connecting terminal. The anisotropic conductive film is preferably press-bonded temporarily to the terminal groups and the bonding assist members.

Further, in the present invention, the bonding assist member may have a predetermined wiring pattern portion and a protrusion provided in an edge portion of the wiring pattern portion and connected to a fixed potential line on the side of the circuit board.

In the present invention, it is preferable that the protrusion of the bonding assist member is provided in a position of the wiring pattern portion, which is opposing to a center portion of the circuit board. The protrusion may be formed such that it is connected to a ground line within the circuit board to ground the wiring pattern portion of the bonding assist member.

In the present invention, the wiring pattern portion of the bonding assist member may take in the form of a rectangular shape having a plurality of wiring lines extending substantially in parallel to each other or in lattice form or in the form of a rectangular conductive film having a plurality of holes arranged in a honeycomb manner. The hole may be circular or polygonal.

The liquid crystal display device according to the present invention is composed of flexible substrates and the circuit board connected to a liquid crystal panel through the above mentioned connection structure.

The mounting method of the liquid crystal display device, according to the present invention, is to connect terminals on one sides of the flexible substrates to the terminal portions of one of the substrates constructing the liquid crystal panel and the circuit board to terminals on the other side of the flexible substrates through the anisotropic conductive film. The mounting method comprises the steps of arranging a plurality of terminal groups at a predetermined interval, each terminal group including a plurality of terminals each being an exposed portion of an internal wiring of the circuit board, on a connecting region of the circuit board, which is provided by removing a surface protection member in the vicinity of at least one edge portion of the circuit board, arranging a bonding assist member between adjacent connecting terminal groups in the connecting portion on the circuit board, temporarily press-bonding an electrically conductive adhesive film containing an electrically conductive adhesive provided on a separator onto the connecting terminal groups and the bonding assist members, peeling the separator off from the electrically conductive adhesive film and then finally press-bonding the respective connecting terminals of the connecting terminal group on the other side of the flexible substrates.

In the present invention, it is preferable that the temporary press-bonding is performed by pressing the electrically conductive adhesive film with the separator by a press-bonding head at press-bonding temperature in a range from about 40° C. to about 100° C. and press-bonding pressure in a range from about 0.2 MPa to about 2 MPa.

That is, according to the mounting method of the present invention, in connecting the terminals on the one side of the flexible substrates to the connecting terminal portion provided in the peripheral portion of the TFT substrate having the thin film transistors formed thereon as the switching elements and the opposing substrate of the liquid crystal panel with the liquid crystal being sealed in the gap between the substrates, and connecting the connecting substrate to the terminals of the other side of the flexible substrates through the anisotropic conductive film, the bonding assist member formed of the same material as that of the connecting terminal and having a predetermined configuration is formed in the region of the connecting substrate in which the coating resin is removed and no terminal group is formed. With the provision of the bonding assist members, it is possible to prevent the peeling-off of the anisotropic conductive film from the exposed portions of the connecting substrate to thereby relax the surface irregularity of the connecting substrate in the temporary press-bonding step in which transmission of heat and pressure to the exposed portions of the connecting substrate is insufficient.

Further, the contact of the anisotropic conductive film to the connecting substrate can be improved by using the bonding assist member having a lattice or honeycomb wiring pattern, so that it is possible to reliably restrict the contact degradation and/or the shortage of connecting strength caused by the peeling-off of the anisotropic conductive film during the temporary press-bonding, during the final press-bonding.

Further more, by providing a protrusion on the bonding assist member and connecting the protruded portion to a fixed potential line such as a ground (GND) line in the connecting substrate, it is possible to put the terminal groups under influence of the fixed potential line to thereby effectively shield the terminal groups against external noise and restrict potential variation of the connecting terminals. In addition, it is possible to restrict transmission of heat from the press-bonding head through the bonding assist member into the connecting substrate during the final press-bonding with heat.

Since, according to the present invention, expendables such as the shock-absorbing material is not used and only the bonding assist members are formed simultaneously with the formation of the wiring pattern of the connecting substrate, it is possible to restrict the cost of the liquid crystal display device and reliably prevent the degradation of terminal contact.

DETAILED DESCRIPTION OF THE PREFERRED EMBODIMENTS

In a connecting structure according to a preferred embodiment of the present invention, for connecting flexible substrates connected to terminal portions of one of substrates constituting a liquid crystal display panel to connecting substrates through an electrically conductive adhesive film such as an anisotropic conductive film (ACF), bonding assist members each formed of the same material as that of an internal wiring or the connecting terminal of the connecting substrate and having substantially the same height as that of the connecting terminal is provided between adjacent terminal groups. The terminal groups each including a plurality of connecting terminals are provided in terminal forming regions of a non-coating portion of the connecting substrate, which is provided in the vicinity of a side portion thereof by removing a protective coating resin thereon, to relax a step between a terminal group in the terminal forming region in the non-coating portion and an exposed region between adjacent terminal groups to thereby make the ACF in an intimate contact with the terminal groups as well as the exposed regions uniformly throughout thereof during a temporary press-bonding step of the ACF at low temperature, prevent a peeling-off and/or breakage of the ACF in the exposed regions and improve the reliability of electrical connection.

The preferred embodiment will be described in more detail with reference to FIG. 1 to FIG. 6C.

Figure 1:
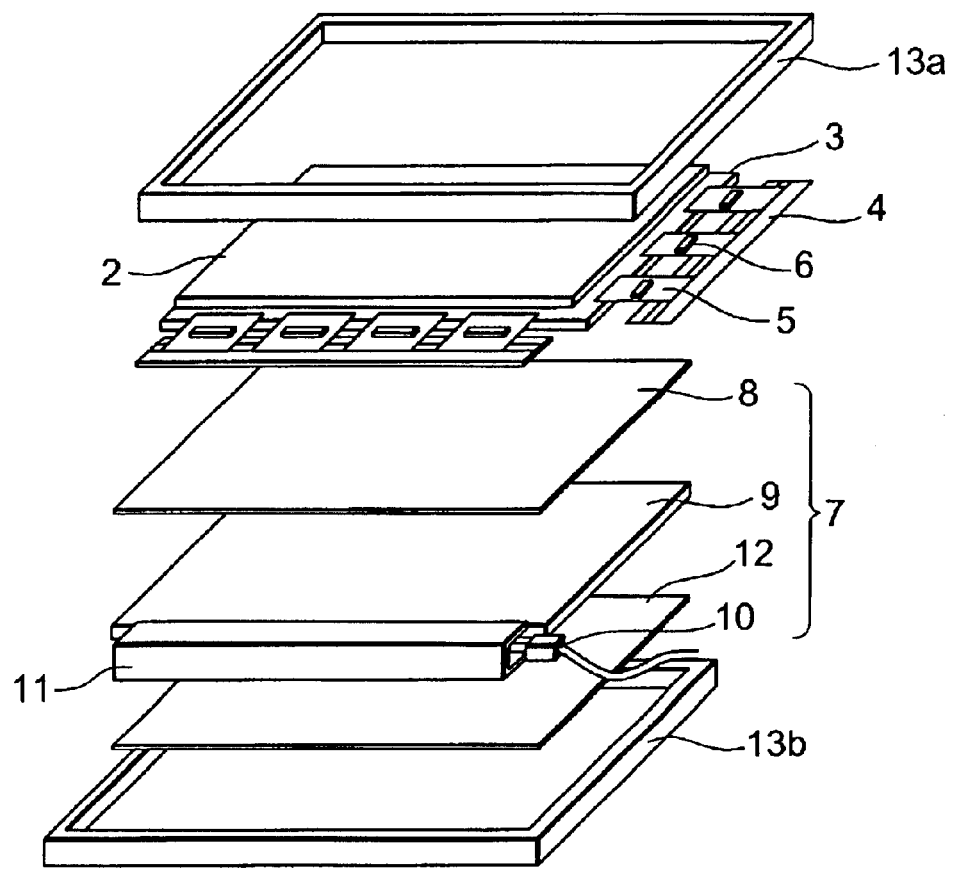
FIG. 1 is a perspective view of a disassembled liquid crystal display device, showing a whole construction of the liquid crystal display device.

First, a construction of a liquid crystal display device will be described with reference to FIG. 1. In general, the liquid crystal display device 1 is constructed with a liquid crystal display panel 2 composed of a TFT substrate on which thin film transistors, etc., are formed as switching elements, an opposing substrate and liquid crystal sealed in a gap between the TFT substrate and the opposing substrate, a backlight 7 composed of a fluorescent lamp 10 for illuminating the liquid crystal panel, a reflector 11 for reflecting light from the fluorescent lamp 10, a light guide plate 9 for guiding light reflected by the reflector 11 to the liquid crystal display panel 2, an optical sheet 8 for controlling polarization of incident light, etc., and a reflection sheet 12, etc., casings 13a and 13b for supporting the above mentioned components, flexible substrates 5 to be connected to terminal portions 3 provided in peripheral portions of one of the TFT substrate and the opposing substrate of the liquid crystal display panel 2 and connecting substrates 4 on which drive circuits for driving the liquid crystal, etc., are formed.

The flexible substrate 5 may be a tape carrier package (TCP) constructed by providing a metal conductor on, for example, a polyimide resin film and having IC6, etc., formed thereon for driving the liquid crystal display panel. Alternatively, the flexible substrate may be a mere flexible substrate having no IC6 or a chip-on-film (COP).

Electrical connection between connecting terminals 4b provided on the connecting substrates 4 and conductors arranged on the flexible substrates 5 is performed by using an electrically conductive adhesive. In the invention, an anisotropic conductive film (ACF) 20 formed of a highly insulating resin such as epoxy or acrylic resin and electrically conductive particles dispersed therein is used as the conductive adhesive. The ACF 20 is temporarily press-bonded to the connecting terminals 4b of the connecting substrate 4 at low temperature. Thereafter, the flexible substrates 5 are mounted on the connecting substrates and then the ACF is pressed down at higher temperature to realize the electric connection and solidify the adhesive so that the electric connection thus made is fixed.

The connecting substrate 4 is a lamination of a glass fiber cloth base, an epoxy resin layer and a copper layer in which a wiring pattern is formed. The lamination will be referred to as a glass-epoxy base 4a, hereinafter. The connecting terminals 4b are formed on the connecting substrate 4 by plating the copper layer with gold or nickel. Other parts such as capacitors, IC's and resistors may be mounted on the connecting substrate 4. Although a surface of the connecting substrate 4 is completely coated with coating resin such as resist resin, the coating resin on the connecting regions of the connecting terminals 4b and regions in which the above mentioned parts are mounted is removed to form a non-coating portion 14 and to expose the wiring.

Figure 2A:
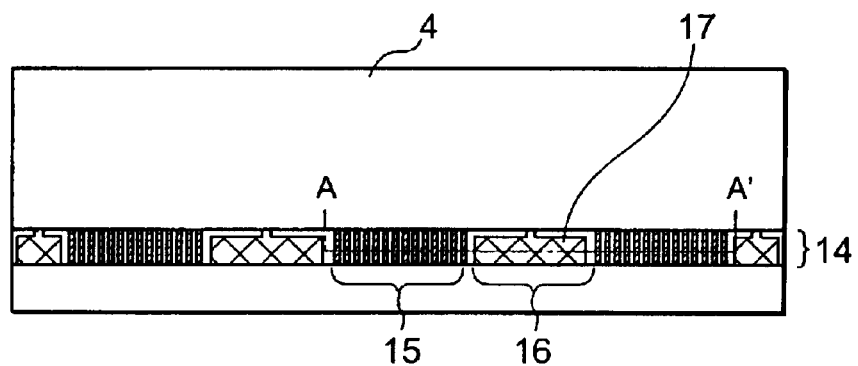
FIG. 2A is a plan view of a connecting substrate according to a first embodiment of the present invention, showing a structure thereof.
Figure 2B:
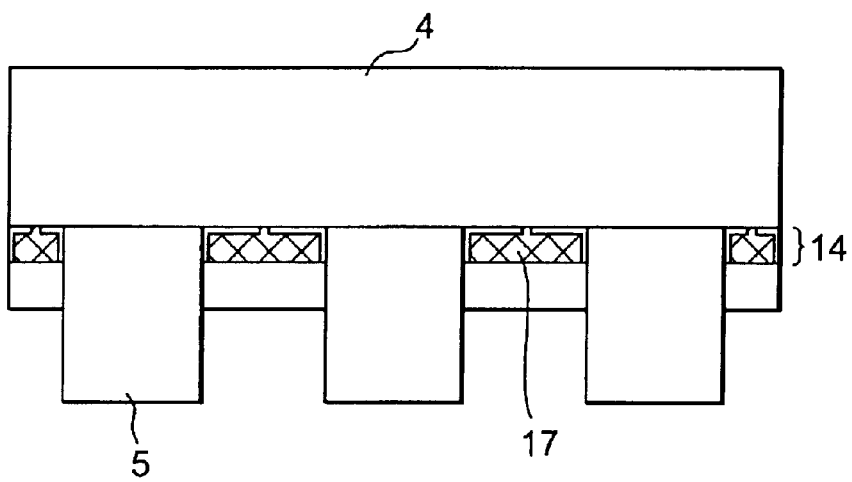
FIG. 2B is a plan view of the connecting substrate shown in FIG. 2A, showing a state where flexible substrates are connected thereto.
Figure 3:
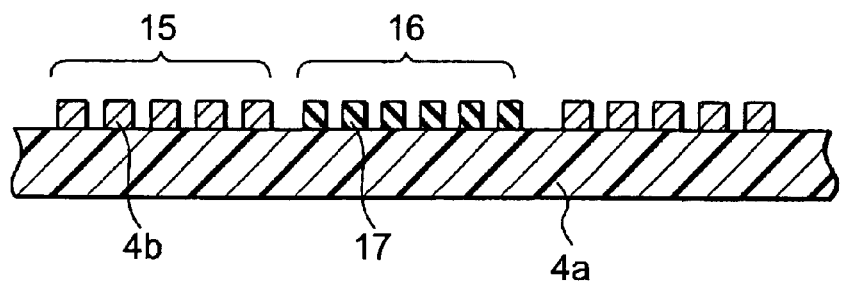
FIG. 3 is a cross section taken along a line A–A' in FIG. 2A.

FIG. 2A, FIG. 2B and FIG. 3 show a portion of the connecting substrate 4 in the vicinity of the connecting region in an enlarged scale. A plurality of terminal groups are provided in terminal group forming regions 15 in such a way that terminal groups of the flexible substrate 5 and the terminal groups of the terminal group forming regions becomes substantially one-to-one correspondence. In a case where there are a plurality of flexible substrates 5, the terminal group forming regions are arranged in one direction at a constant interval. Bonding assist members 17 each having a predetermined configuration are arranged in regions each between adjacent terminal group forming regions or outside the terminal group forming regions in the non-coating portion 14. Incidentally, as shown in FIG. 2B, the flexible substrates 5 are connected to the respective terminal group forming regions 15 and the bonding assist members 17 in bonding assist regions 16 has no electrical and mechanical relation to the flexible substrate 5.

Figure 5A:
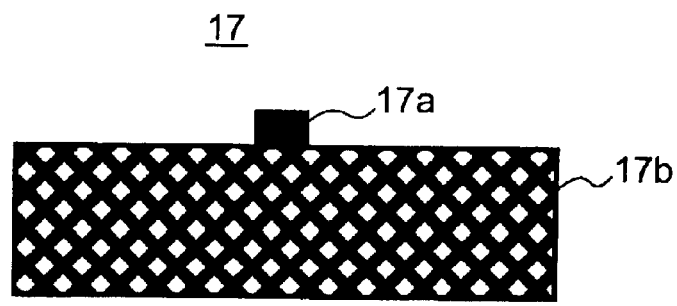
FIG. 5A to FIG. 5D are plan views of various bonding assist members provided on the connecting substrate according to the first embodiment of the present invention.

FIG. 5A shows an example of a wiring pattern of the bonding assist member 17. The bonding assist member 17 includes a wiring pattern portion 17b formed of the same material as that of the internal wiring of the connecting substrate 4 or the connecting terminal 4b thereof to substantially the same height as that of the connecting terminal in the same step as that of forming the internal wiring or the connecting terminal and a protrusion 17a protruding from the wiring pattern toward a center of the connecting substrate 4.

The wiring pattern portion 17b shown in FIG. 5A has a lattice pattern formed by selective etching similar to the selective etching of the internal wiring of the connecting substrate 4 or by surface processing similar to the connecting terminals 4b. The protrusion 17a formed on one side of the bonding assist member 17 on the center side of the connecting substrate 4 and having predetermined width and length is connected to other wiring arranged on the connecting substrate 4 and connected to a GND portion of drive circuits of the liquid crystal display device 1.

Now, the connecting method for connecting the connecting substrate 4 and the flexible substrate 5 will be described with reference to FIG. 4A to FIG. 4C. First, the ACF 20 is temporarily press-bonded onto the connecting substrate 4 on which the terminal groups and the bonding assist members 17 are formed. The ACF 20 is a lamination of a polyethylene terephthalate (PET) layer, which is in the form of a tape and has a good separability, as a separator 19, and an epoxy resin about 10 μm to 100 μm thick painted on the separator 19. The epoxy resin contains metal particles or electrically conductive particles formed by coating plastic resin particles with electrically conductive material are dispersed uniformly. Since the ACF 20 itself contains a resin a main constituent of which is thermosetting or thermoplastic resin, it is fixed to a member to be connected thereto by applying a constant heat and pressure.

Figure 4A:
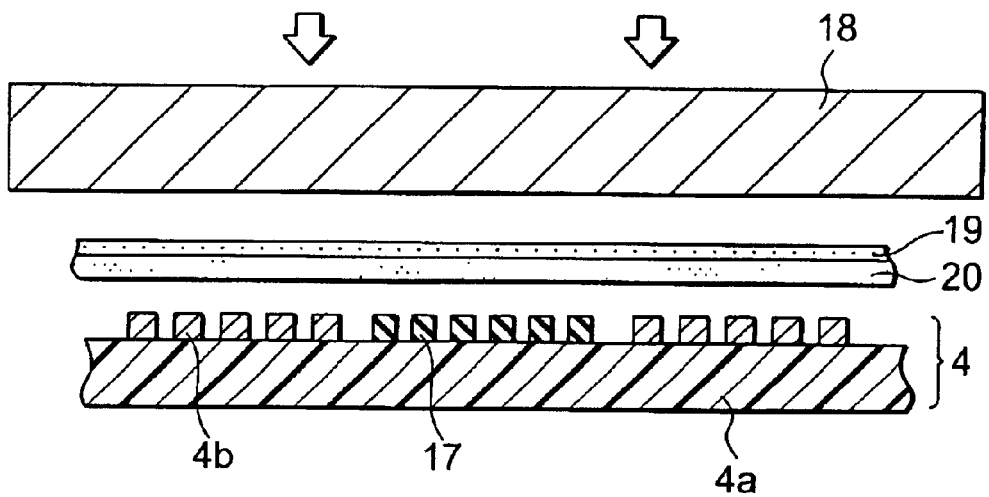
FIG. 4A to FIG. 4C are cross sections showing steps of a connecting method for connecting the connecting substrate and the flexible substrates, according to an embodiment of the present invention.

In order to temporarily press-bonding the connecting substrate 4 and the flexible substrate 5, the ACF 20 is put on the terminal groups arranged in one direction on the connecting substrate 4 and the bonding assist members 17 in such a way that a surface of the ACF 20 is in contact with both the connecting terminals 4b and the bonding assist members 17, as shown in FIG. 4A. Thereafter, in order to stick the ACF 20 to the connecting terminals 4b, the ACF 20 is pressed by a press-bonding head 18, which is formed of a metal material and preliminarily heated directly or indirectly, with a constant pressing force. In this heat-pressing operation by means of the press-bonding head 18, temperature of the head may be in a range from 40° C. to 100° C. and pressure may be in a range from 0.2 MPa to 2 MPa. More preferably, the temperature is within a range from 50° C. to 80° C. and the pressure is within a range from 0.5 MPa to 1.5 MPa. By this temporary press-bonding step, the bonding strength between the ACF 20 and the connecting terminals 4b becomes higher than that between the ACF 20 and the separator 19.

In the structure of the conventional connecting substrate 4, the adhesion of the ACF 20 in the exposed region 16a is low and the ACF 20 is peeled off when the separator 19 is peeled off from the ACF 20, since the terminal groups in the terminal group forming regions 15 are different in height from the exposed region 16a. In the present invention, however, since the bonding assist member 17 having substantially the same height as that of the terminal groups and formed of the same material as that of the connecting terminal 4b is provided in the bonding assist region 16 between the adjacent terminal groups, the heights of the respective regions become substantially the same and temperature of the press-bonding head and pressure applied thereby are substantially uniformly transmitted to the connecting terminals 4b and the bonding assist members 17.

Figure 4B:
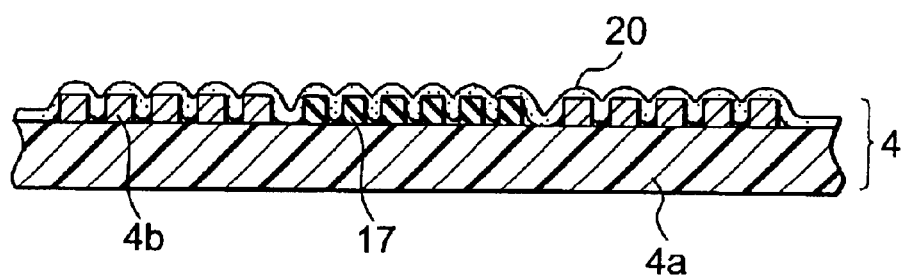
Figure 4C:
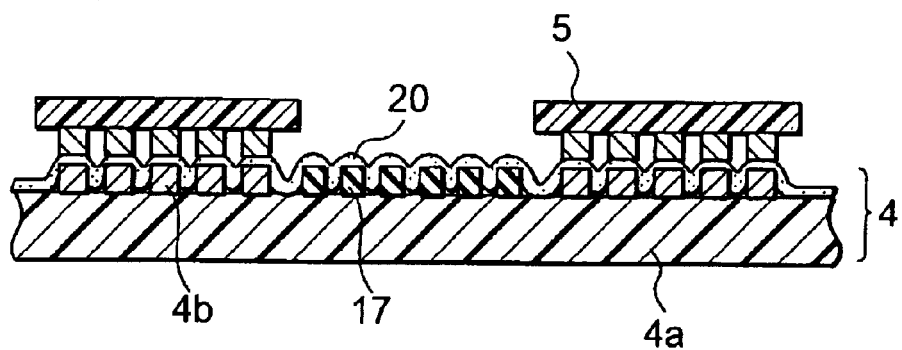

After the ACF 20 itself is cooled to substantially room temperature, the separator 19 is peeled off, so that only the ACF 20 is left on the connecting substrate 4 as shown in FIG. 4B. The temporary press-bonding step, which is necessary for mutual connection of the parts, is completed in this manner. Since, in this embodiment, the bonding strength between the ACF 20 and the bonding assist members 17 provided between the adjacent terminal groups becomes equal to or higher than that between the ACF 20 and the connecting terminals 4b, the peeling-off problem of the ACF 20 from the connecting substrate 4 when the separator 19 is peeled off is solved.

Next, the flexible substrates 5 are put on the connecting substrate 4 to which the ACF 20 is temporarily press-bonded, in such a way that the terminals of the flexible substrates 5 become opposite to the connecting terminals 4b of the connecting substrate 4, respectively. Thereafter, the flexible substrates 5 are heated and pressed by using a press-bonding head functioning similarly to the press-binding head 18 to connect the terminals of the flexible substrates 5 to the connecting terminals of the connecting substrate 4 as shown in FIG. 4C. This is the final press-binding step.

In order to polymerize the epoxy resin, which is the main constituent of the ACF 20, to thereby obtain rigid connection in the final press-bonding step, temperature of the ACF 20 heated by the press-bonding head and pressure applied by the head are preferably in a range from 120° C. to 220° C. and in a range from 2 MPa to 5 MPa, respectively. The liquid crystal display panel 2, the flexible substrates 5 and the connecting substrate 4, which are connected together as mentioned above, are put on the backlight 7 and, by fixedly supporting them by the casings 13a and 13b, the liquid crystal display device 1 is completed.

By providing the bonding assist member 17 between adjacent terminal groups in this manner, heat and pressure are substantially uniformly transmitted from the press-bonding head 18 to the ACF 20 and the underlying portions thereof on the connecting substrate 4 during the temporary press-bonding step. Therefore, the ACF 20 is bonded to the connecting terminals 4b and the bonding assist members 17 with substantially uniform bonding strength. Consequently, the peeling-off of the separator 19 at the end of the temporary bonding step becomes easy and the peeling-off of the ACF 20 or inaccurate bonding position of the ACF 20 due to positional deviation of the ACF 20, which is caused by uneven bonding strength between the ACF 20 and the connecting terminals 4b, does not occur. Further, it is possible to prevent the degradation of electric contact and the shortage of bonding strength, which may occur when the ACF 20 is peeled off, from occurring.

Further, since the protruded portion 17a of the bonding assist member 17, which protrudes toward the center portion of the connecting substrate 4, is connected to the GND line in the connecting substrate 4, each terminal group is surrounded by GND potential. Therefore, it is possible to restrict variation of signal voltages due to external noise or mutual interaction between terminal groups to thereby prevent disorder of display of the liquid crystal display device 1. Further, although the bonding assist member 17 is formed of a metal having good thermal conductivity, it is possible to restrict heat flow from the press-bonding head 18 to the connecting substrate 4 since the connection between the connecting substrate 4 and the bonding assist member is made between the protrusion 17a of the bonding assist member 17 and the center portion of the connecting substrate 4.

Further, since the bonding assist member 17 is formed of the same material as that of the internal wiring or the connecting terminal 4b of the connecting substrate 4 in the same step as that of forming the internal wiring or the connecting terminals 4b, for example, in a patterning step by selective etching of a metal film formed on the connecting substrate 4, it is possible to improve the bonding strength of the ACF 20 without adding any new step and to reduce the cost of the liquid crystal display device 1 without necessity of the shock-absorbing material.

Figure 5B:
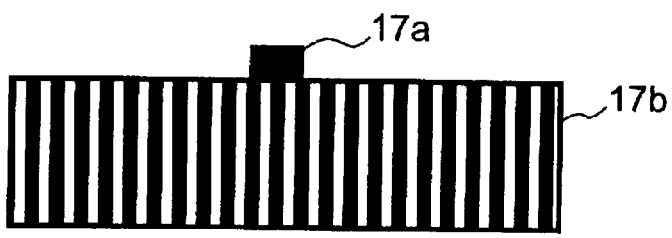
Figure 5C:
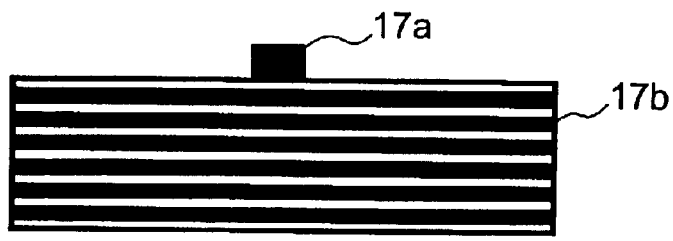
Figure 5D:
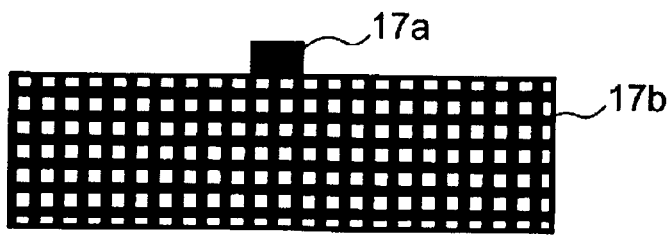

Incidentally, although the bonding assist member 17 has been described as having the lattice wiring pattern, the pattern of the bonding assist member 17 may be any provided that the adhesion of the ACF 20 is similar to or better than that of the connecting terminal 4b. For example, as shown in FIG. 5B, FIG. 5C and FIG. 5D, the bonding assist member 17 may have a wiring pattern including parallel straight lines extending in the same direction as that of the connecting terminals (FIG. 5B), a wiring pattern including parallel lines extending substantially orthogonal to the connecting terminals 4b (FIG. 5C) or a wiring pattern (FIG. 5D), which is a combination of the wiring patterns shown in FIG. 5B and FIG. 5C. In these wiring patterns of the bonding assist member 17, width and pitch of the wiring lines can be set arbitrarily. However, when the width is set smaller than a gap between adjacent connecting terminals 4b of the terminal group, intrusion of the ACF 20 to the bonding assist member is improved, so that the adhesion thereof is improved.

Figure 6A:
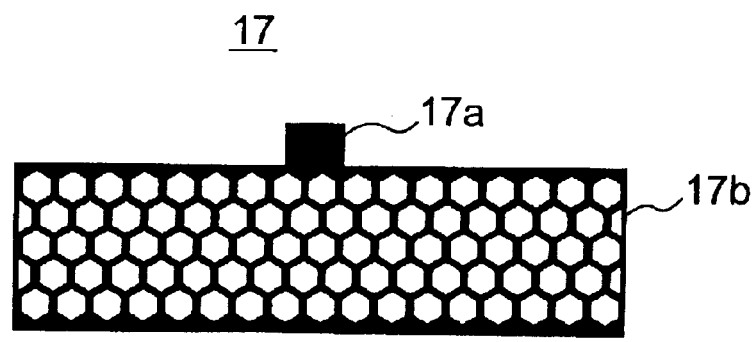
FIG. 6A to FIG. 6C are plan views of other bonding assist members according to the present invention.
Figure 6B:
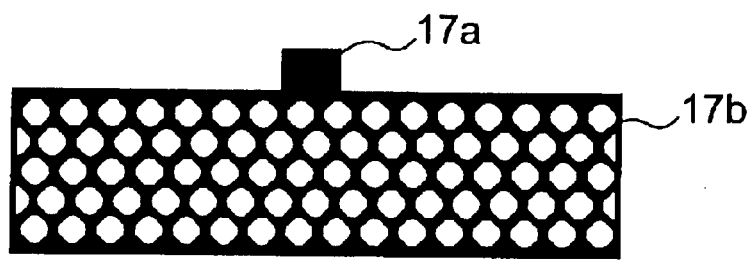

Further, as shown in FIG. 6A and FIG. 6B, a honeycomb wiring pattern may be employed in the bonding assist member 17. In such case, it is possible to make the intrusion of the ACF 20 more reliable by the complicated wiring pattern. The configuration of holes forming the honeycomb wiring pattern may be circular or polygonal and the number of holes in each line and the number of lines thereof may be set arbitrarily.

Figure 6C:
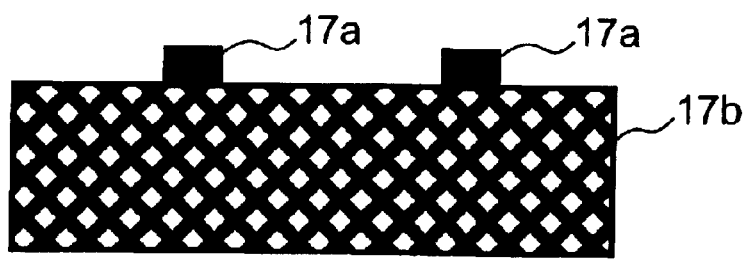
Figure 7A:
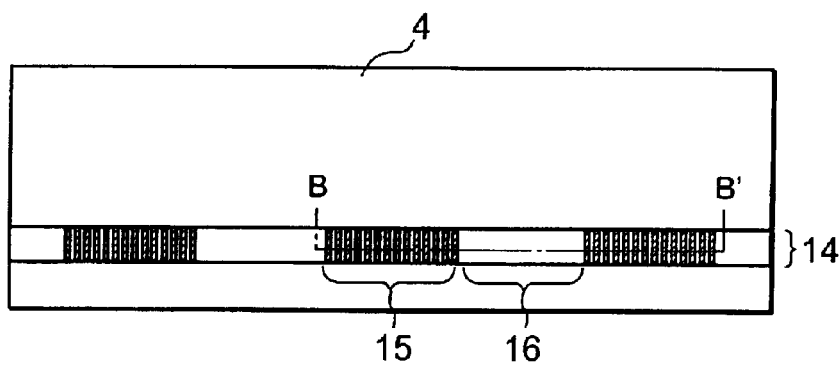
FIG. 7A is a plan view of a conventional connecting substrate.
Figure 7B:
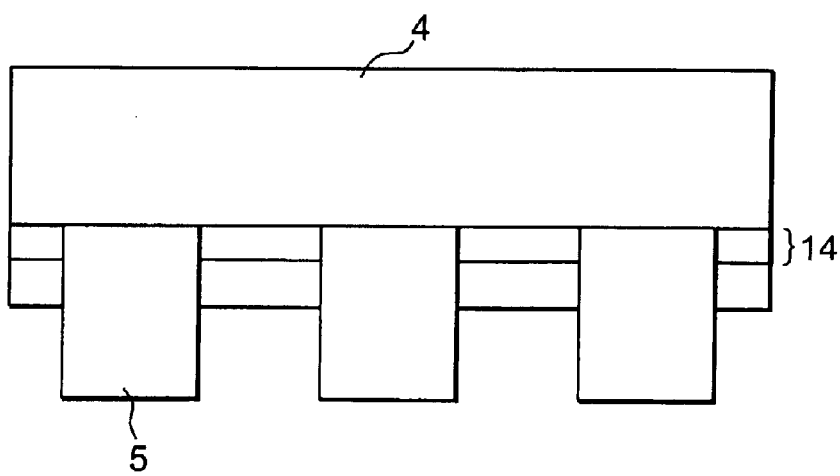
FIG. 7B is a plan view of the connecting substrate shown in FIG. 7A, showing a state where flexible substrates are connected thereto.
Figure 8:
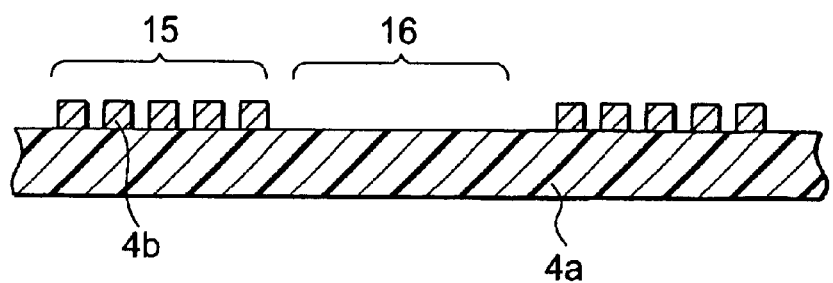
FIG. 8 is a cross section taken along a line B–B' in FIG. 7A.
Figure 9A:
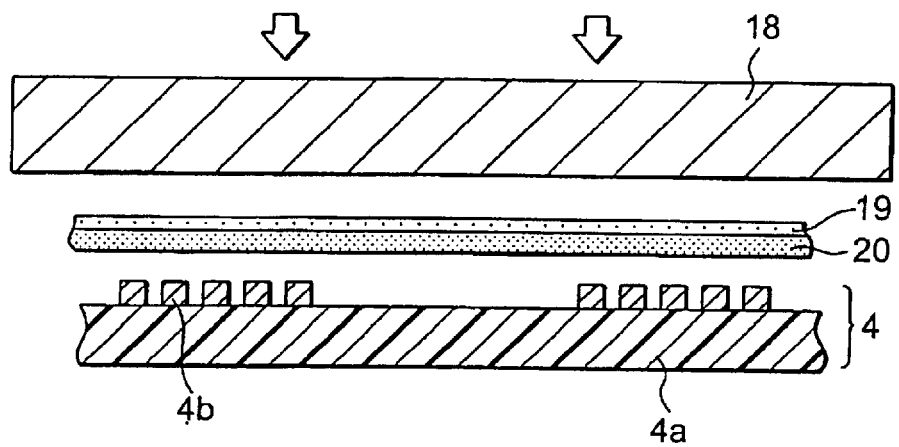
FIG. 9A to FIG. 9C are cross sections showing steps of a conventional connecting method for connecting the connecting substrate and the flexible substrates, according to an embodiment of the present invention.
Figure 9B:
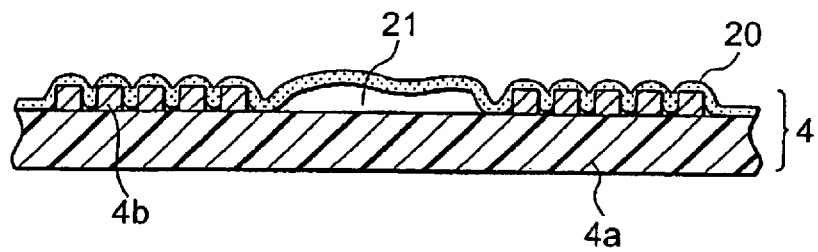
Figure 9C:
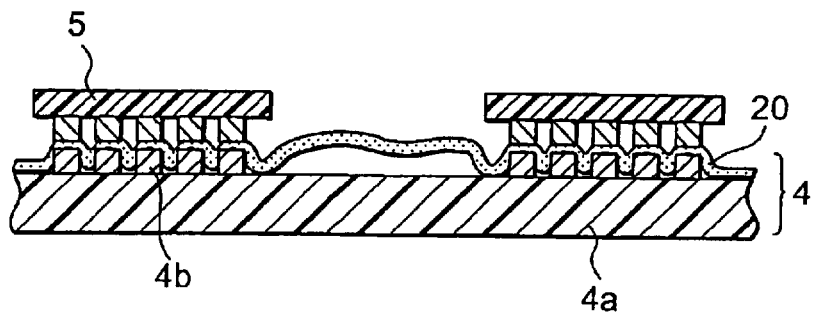
Figure 10A:
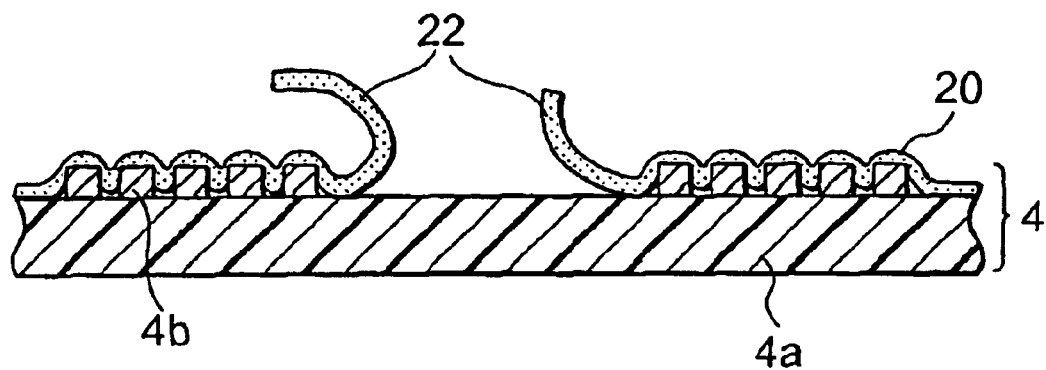
FIG. 10A and FIG. 10B are cross sections of the conventional connecting structure, showing problems of the conventional connecting structure.
Figure 10B:
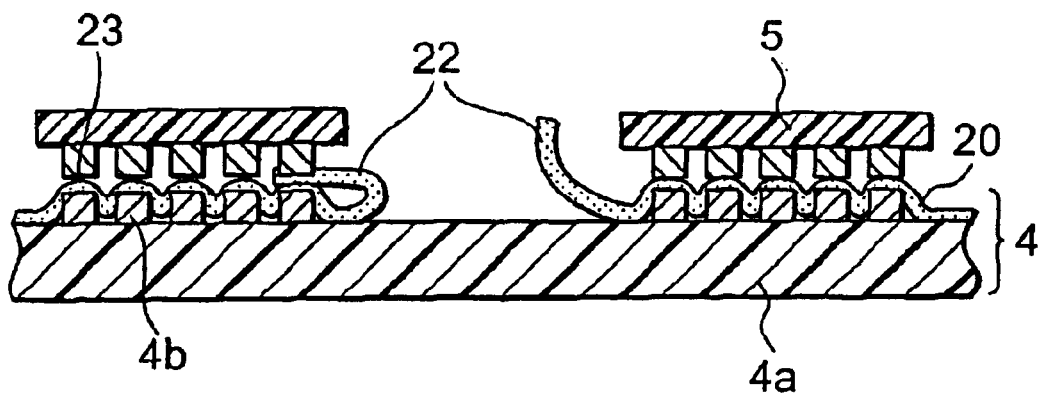
Figure 11A:
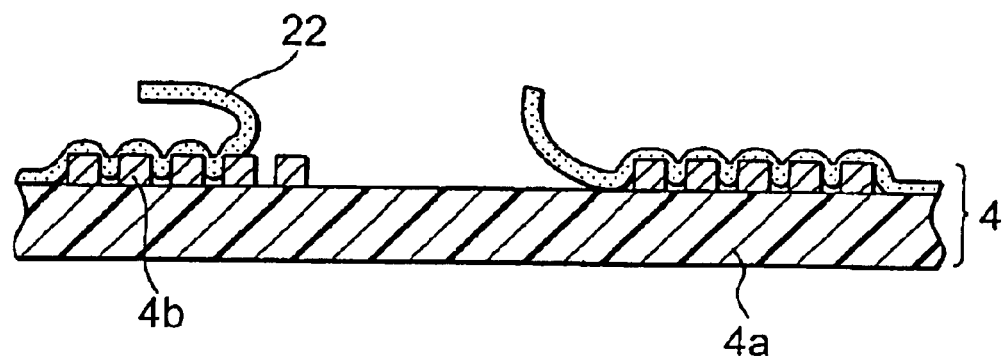
FIG. 11A and FIG. 11B are cross sections of the conventional connecting structure, showing problems of the conventional connecting structure.
Figure 11B:
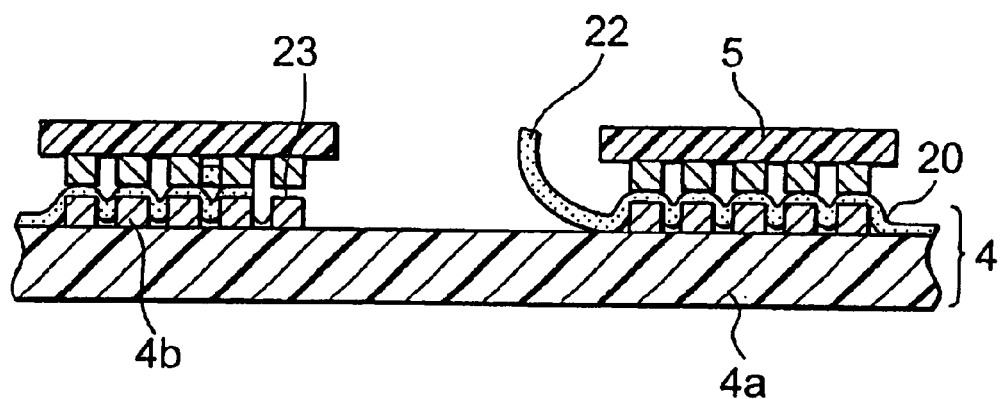

The configuration of the protrusion 17a is any provided that it can be connected to the GND line in the connecting substrate and the width and length of the protrusion 17a can be changed on demand. Further, a plurality of protrusions 17a may be provided as shown in FIG. 6C. In such case, since the bonding assist member 17 is formed of a material such as a thin copper film having good thermal conductivity and heat from the press-bonding head 18 is transmitted to the center side of the connecting substrate 4 through the protrusions 17a, the width of each protrusion 17a is preferably made as small as possible such that heat conductance becomes large. When it is not necessary to connect the protrusion to the GND line, the protrusion 17a may be removed and the boding assist member 17 may be provided separately from the internal wiring of the connecting substrate 4.

The bonding assist members 17 in the non-coating portion 14 do not always have identical configurations. That is, the bonding assist members 17 in the bonding assist regions of the non-coating portion may have different configurations or the configurations thereof may be changed correspondingly to a variation of length of the bonding assist regions. For example, when the bonding assist region between adjacent terminal groups is long, the wiring pattern portion 17b of the bonding assist member 17 may be made complicated in order to improve the adhesion and, when it is short, the configuration of the wiring pattern portion 17b may be made identical to that of the connecting terminals 4b so that the adhesion becomes uniform throughout the non-coating portion 14.

Although the case where the bonding assist member 17 is formed of the same material as that of the internal wiring or the connecting terminal 4b of the connecting substrate 4 in the same step as the forming step of the connecting terminals 4b has been described, it is enough that the adhesion of the ACF 20 to the bonding assist member 17a is similar to or higher than that to the connecting terminals 4b. It is possible to intentionally change the heights of the connecting terminals 4b and the bonding assist member 17 by changing thickness of the gold or nickel plate on the thin copper film. For example, the plate on the bonding assist member 17 is made thicker than that on the connecting terminal 4b in order to improve the adhesion of the ACF 20 thereto.

Although the connection between the connecting substrate 4 and the flexible substrates 5 of the liquid crystal display device has been described, the present invention can be applied to any device in which a connection between substrates is made by using an anisotropic conductive film.

As described hereinbefore, according to the connecting structure of circuit board, the liquid crystal display device having the same connecting structure and the mounting method of the liquid crystal display device of the present invention, the following effects can be obtained.

A first effect of the present invention is that it is possible to prevent degradation of contact between the connecting substrate and the flexible substrate, which is caused by degraded adhesion of the ACF in the exposed region between adjacent terminal groups when the separator of the ACF is peeled off from the ACF during the temporary press-bonding step.

This is because the bonding assist member or members having substantially the same height as that of the terminal groups are provided in the exposed regions between the terminal groups to make the height of the whole region on which the ACF is bonded uniform to thereby make transmission of heat and pressure from the press-bonding head thereto uniformly.

A second effect of the present invention is that it is possible to protect the connecting terminals against external noise to thereby restrict variation of voltage due to mutual interaction of the terminals and it is possible to restrict flow of heat from the press-bonding head to the connecting substrate.

This is because it is possible to make the bonding assist member a GND potential by connecting the protrusion provided on the bonding assist member on the center portion side of the connecting substrate to the GND line within the connecting substrate so that the terminal groups are put under influence of GND potential and it is possible to restrict flow of heat from the press-bonding head by making the width of the protrusion as small as possible during the temporary press-bonding or the final press-bonding step.

A third effect of the present invention is that it is possible to improve the reliability of connection between the connecting substrate and the flexible substrate without requiring additional fabrication step or additional materials.

The reason for this is that the bonding assist member is formed of the same material as that of the internal wiring or the connecting terminal of the substrate in the same step as that of forming the connecting terminal or the internal wiring without necessity of addition of new steps and necessity of members such as shock-absorbing material.

What is claimed is:

1. A connecting structure of a circuit boards, comprising:
   a circuit board connected to a substrate opposing thereto through an electrically conductive adhesive film;
   a connecting region formed by removing a surface protective member in a vicinity of side portions of said circuit board;
   a plurality of connecting terminal groups arranged in said connecting region at a predetermined interval, each connecting terminal group including a plurality of terminals formed by exposing portions of an internal wiring; and
   a bonding assist portion arranged between adjacent ones of said terminal groups in said connecting region, said bonding assist portion including at least one protrusion that connects to a fixed potential line on said circuit board.

2. A connecting structure of a circuit board, as claimed in claim 1, wherein said bonding assist portion is formed of the same material as that of said internal wiring of said connecting terminal and has substantially the same height as that of said connecting terminal and an isotropic conductive film is press-bonded temporarily to said terminal groups and said bonding assist portion.

3. A liquid crystal display device having a circuit board and a plurality of flexible substrates connected to a liquid crystal panel through a connecting structure claimed in claim 1.

4. A connecting structure of a circuit board, comprising:
   a circuit board connected to a substrate opposing thereto through an electrically conductive adhesive film;
   a connecting region formed by removing a surface protective member in a vicinity of side portions of said circuit board;
   a plurality of connecting terminal groups arranged in said connecting region at a predetermined interval, each connecting terminal group including a plurality of terminals formed by exposing portions of an internal wiring; and
   a bonding assist portion arranged between adjacent ones of said terminal groups in said connecting region, wherein said bonding assist portion has a predetermined wiring pattern portion and a protrusion provided in an edge portion of said wiring pattern portion and connected to a fixed potential line on the side of said circuit board.

5. A connecting structure of a circuit board, as claimed in claim 4, wherein said protrusion is provided in a position of said wiring pattern portion on a center side of said circuit board.

6. A connecting structure of a circuit board, as claimed in claim 4, wherein said protrusion is connected to a ground line within said circuit board and said bonding assist portion is grounded.

7. A connecting structure of a circuit board, as claimed in claim 4, wherein said wiring pattern portion takes in the form of a rectangular shape having a plurality of wiring lines extending substantially in parallel to each other.

8. A connecting structure of a circuit board, as claimed in claim 4, wherein said wiring pattern portion takes in the form of a rectangular shape having a lattice wiring.

9. A connecting structure of a circuit board, as claimed in claim 4, wherein said wiring pattern portion takes in the form of a rectangular shape having a plurality of circular holes arranged along a plurality of lines to form a honeycomb configuration.

10. A connecting structure of a circuit board, as claimed in claim 4, wherein said wiring pattern portion takes in the form of a rectangular shape having a plurality of polygonal holes arranged along a plurality of lines to form a honeycomb configuration.

* * * * *